United States Patent [19]

Genuit et al.

[11] Patent Number: 4,521,692
[45] Date of Patent: Jun. 4, 1985

[54] MOTOR GENERATOR SHUTDOWN CIRCUIT FOR EXTENDED RIDETHROUGH

[75] Inventors: Luther L. Genuit, Scottsdale; John R. Nowell, Phoenix, both of Ariz.

[73] Assignee: Honeywell Information Systems Inc., Phoenix, Ariz.

[21] Appl. No.: 366,739

[22] Filed: Apr. 8, 1982

[51] Int. Cl.³ ............................................. H02H 3/46
[52] U.S. Cl. .................................... 290/4 A; 307/86; 361/52
[58] Field of Search .......... 290/40 A–40 C, 290/40 E, 40 F, 4 A, 4 B, 4 C; 322/4; 307/67, 68, 86, 87; 324/78 D; 361/52

[56] References Cited

U.S. PATENT DOCUMENTS 3,315,148  4/1967  Grillo ..................................... 322/4
3,990,007  11/1976  Hohhof ........................... 324/78 D
3,993,984  11/1976  Penrod ............................ 324/78 D Primary Examiner—Vit W. Miska
Assistant Examiner—Shelley Wade
Attorney, Agent, or Firm—A. A. Sapelli; L. J. Marhoefer; J. S. Solakian

[57] ABSTRACT

This invention relates to device for detecting a threshold value of the frequency of an input signal. A gate signal is generated from the input signal, whose period has a relationship to the frequency of the input signal. A counter counts pulses from an oscillator having a predetermined rate. The gate signal enables the counter for a predetermined period of time and samples the count at the end of the period of time to determine whether the threshold value has been attained, the count stored in the counter being indicative of the frequency of the input signal.

3 Claims, 4 Drawing Figures

MOTOR GENERATOR SHUTDOWN CIRCUIT FOR EXTENDED RIDETHROUGH

RELATED APPLICATION

The present patent application is related to U.S. patent application, Ser. No. 366,738, now U.S. Pat. No. 4,443,709, entitled "Frequency Responsive System Power Sequencer", by L. Genuit, et al., filed on even date herewith, and assigned to Honeywell Information Systems Inc., the assignee of the present application.

BACKGROUND OF THE INVENTION

This invention relates to power monitoring equipment of power derived from a motor-generator set, and more particularly, to a frequency detection circuit for maximizing the time before shutdown of the generator power upon detecting an impending power failure.

In systems which derive power from a public utility, various schemes are utilized in an attempt to isolate the system from interruption in the utility supplied power. One such isolation scheme interposes a motor-generator set between the utility supplied power and a power supply which generates supply voltages required by the system. When the utility supplied power delivered to the motor is interrupted, the inertia of the motor-generator set is sufficient to permit operation through a short term interruption or to allow a period of time to bring the system to an orderly halt, so that upon restoration of the utility supplied power the system can proceed without any special recovery procedures. The need for such an orderly halt is especially true in a data processing system.

In present systems, the motor-generator design can incorporate a timer that removes excitation from the generator after a fixed period of time from the time in which the utility supplied power (or primary power) interruption occurs. The timer time-out period is selected based on the generator frequency decay under full load conditions. As a result, such present designs may not fully utilize the available "ridethrough energy" especially under partially loaded conditions. (The "ridethrough energy" is the energy stored in the fly wheel, or inertia, of the motor-generator set.)

The present invention incorporates a generator shutdown scheme based on sensing or monitoring the generator frequency. The generator excitation is not removed until the sensed generator frequency has fallen below a detected predetermined value, the predetermined value being the threshold frequency at which the power supplies cannot properly generate and regulate the supply voltages to the system.

Accordingly, it is an object of the present invention to provide a device for sensing frequency.

It is another object of the present invention to provide a device for making full utilization of stored energy under all load conditions.

It is a further object of the present invention to provide a device for accurately sensing frequency so that shutdown can be co-ordinated with other events that are initiated by frequency sensing.

These and other objects of the present invention will become more apparent when taken in conjunction with the following description and attached drawings, wherein like characters indicate like parts, and which drawings form a part of the present application.

SUMMARY OF THE INVENTION

Therefore, there is provided in a power generating system, wherein converted power is supplied to at least one equipment cabinet of a data processing system, a motor-generator set driven by an input power signal which is subject to power interruptions. The generator outputs a derived power signal, under control of a generator control unit, which is utilized to generate the converted power. The power generating system further includes a frequency monitoring device for detecting a predetermined threshold value of frequency of the derived power signal. The frequency monitoring device comprises a signal generating element, having an input terminal adapted to receive the derived power signal, which generates a gating signal having a first and second state. The duration of the first state of the gating signal has a predetermined relationship to the frequency of the derived power signal. A counter element, having an input terminal adapted to receive a clock signal of a predetermined frequency, counts the clock signals during an enable period of the counter element determined by the first state of the gating signal. The counter element generates an output signal when a predetermined count is attained, the predetermined count corresponding to the predetermined threshold value of frequency of the derived power signal. The output signal is coupled to the generator control unit for disabling the derived power signal output of the generator.

DETAILED DESCRIPTION

Figure 1:
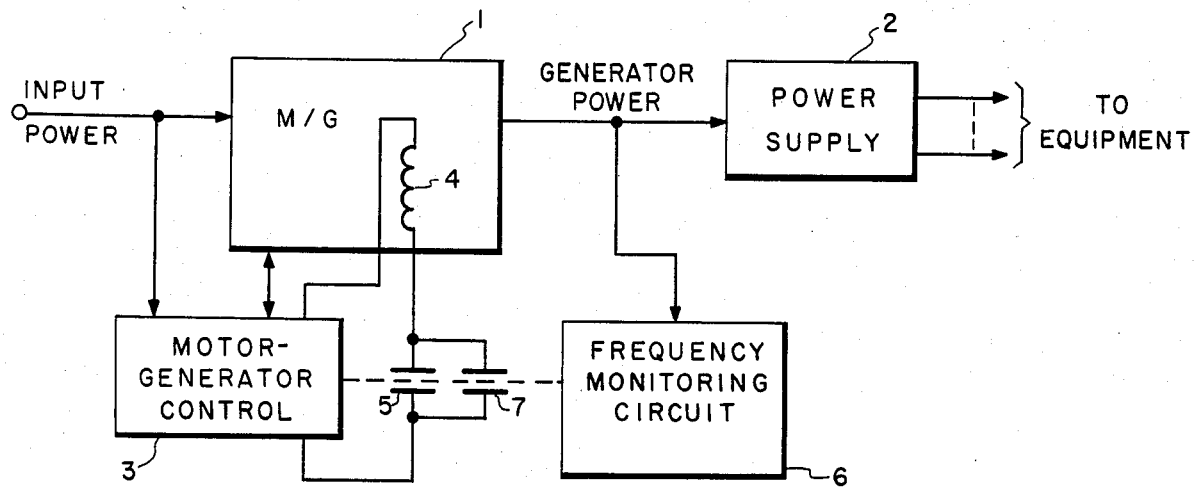
FIG. 1 shows a typical power generator arrangement utilizing a motor-generator set for isolating power, supplied by a utility company, from equipment utilizing the power in some converted form.

Referring to FIG. 1, there is shown a typical power generation arrangement utilizing a motor-generator set for isolating power supplied by a utility company (utility supplied power) from equipment utilizing the power in some converted form. The isolation scheme interposes the motor-generator set (M/G) 1 between the utility supplied power (or INPUT POWER) and a power supply 2 thereby providing the capability to ride through a majority of short term dips and interruptions in the utility supplied power, and providing the capability to orderly shut down equipment when it appears the ridethrough capability is going to be exceeded. INPUT POWER is provided to the motor of the motor-generator set (M/G) 1 which in turn supplies the power supply 2 with GENERATOR POWER which is equivalent to the INPUT POWER. The power supply 2 in turn generates and supplies the equipment with power in some converted form. Motor generator control 3 is coupled to the motor-generator set 1 for providing the necessary control, the control being a function of the sensed INPUT POWER. Various motor-generator control 3 devices are well known in the art. Field winding 4 (of the generator) is shown connected in series with time-out relay 5. Control of timeout relay 5 is provided by motor-generator control 3. Frequency monitoring circuit 6 senses the GENERATOR POWER and provides control of the ride through extension relay (or more simply referred to as the extension relay 7).

In the preferred embodiment, the INPUT POWER (also referred to herein as primary power) is 208 volts, 3 phase, 60 Hz. The GENERATOR POWER is 208 volts, 3-phase, about 59.4 Hz due to slippages in motor-generator set 1. Upon interruption of the INPUT POWER, a timer (not shown) within motor-generator control 3 starts its time out and at the end of one second would cause time out relay 5 to open, thereby removing generator excitation. (It will be recognized by those skilled in the art that various methods may be utilized to remove generator excitation. The arrangement shown herein of the generator field winding 4 in series with time out relay 5 is to functionally indicate a method for controlling generator excitation.) However, extension relay 7, which will be normally closed during normal operation, will cause generator excitation to remain until the frequency monitoring circuit 6 detects the GENERATOR POWER to have reached 48 Hz or less. When the generator power frequency has reached 48 Hz or lower, the frequency monitoring circuit 6 will cause extension relay 7 to open. At this point in time, since both time out relay 5 and extension relay 7 are open, generator excitation will be removed. In the preferred embodiment 48 Hz was determined as being the threshold in which the power supply 2 would fail to properly generate and regulate the power supplied to the equipment. By providing extension relay 7 in parallel with time out relay 5, generator power will be available for a longer period of time thereby permitting a longer time period for power ridethrough or equipment shutdown. Although not shown, it is understood that the equipment will have knowledge of primary power interruption via an input, e.g., an interrupt signal to a central processing unit (CPU) of the equipment or by means of another frequency monitoring circuit sensing generator frequency decay.

Figure 2:
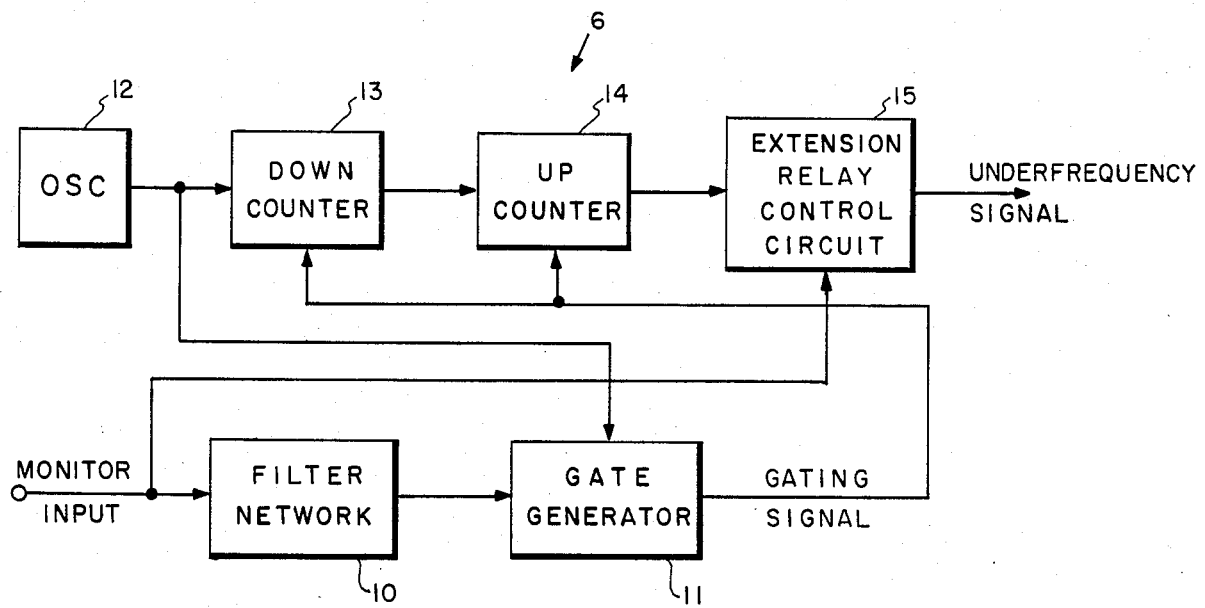
FIG. 2 shows a block diagram of a frequency monitoring circuit of the preferred embodiment of the present invention.

Referring to FIG. 2 there is shown a block diagram of the preferred embodiment of the present invention. The MONITOR INPUT (or GENERATOR POWER) is input to a filter network 10 for removing undesired spikes and harmonics from the signal. The output of the filter network 10 is then coupled to a gate generator 11. The gate generator 11 generates a GATING SIGNAL which is coupled to down counter 13. Down counter 13 counts oscillator pulses coupled from oscillator 12 for a period of time controlled by the GATING SIGNAL. The GATING SIGNAL enables the down counter for a predetermined period of time, the predetermined period of time being a cycle, or a multiple number of cycles of the MONITOR INPUT, or otherwise having some relationship to the MONITOR INPUT. Thus, by determining the count in the down counter and knowing the rate of the oscillator 12 pulses, the frequency of the MONITOR INPUT can be determined. In the preferred embodiment, the down counter is initially set with the number of counts corresponding to a frequency of 48 Hz. During the window, or enabling portion of the GATING SIGNAL, the counter is counted downward towards zero. If the counter reaches zero, the monitor input frequency is thus established to be less than 48 Hz. When down counter 13 reaches zero a signal is output to up counter 14 resetting up counter 14 to zero, which in turn outputs a signal to the extension relay control circuit 15 which in turn outputs an UNDER-FREQUENCY signal. The UNDER-FREQUENCY signal causes extension relay 7 to open. Extension relay control circuit 15 is coupled to the MONITOR INPUT to assure that the extension relay will not be energized during motor-generator 1 start-up. In addition, up counter 14 must count a predetermined number of GATING SIGNALS during start-up before enabling the extension relay in conjunction with the operation of the extension relay control circuit 15.

The operation of the frequency monitor circuit 6 will now be described in detail in conjunction with FIGS. 3 and 4. It will be understood, that when discussing the various digital signal levels in the following description, a zero or low signal level refers to a logic "zero", and similarly a high, positive, or one signal level refers to a logic "one". The filter network 10 is comprised of a resistor 101 and capacitor 102, which form an integration circuit for removing noise spikes and harmonics from the MONITOR INPUT signal. The output of the filter network 10 is coupled to the gate generator 11. The gate generator 11 is comprised of comparator 110, J-K flip-flop 120, a dual D-type flip-flop 130, and NAND gate 140. The output signal of filter network 10, waveform A of FIG. 4 having a period of T1, is coupled to the input of comparator 110. Comparator 110 converts the sine-wave signal to a square wave, waveform B of FIG. 4, also having a period of T1.

J-K flip-flop 120, which performs a divide by two operation is triggered by each successive negative edge of waveform B and outputs a signal (waveform C of FIG. 4) having a period T2 which is twice the period of the input waveform. Therefore, the period of the waveform C of FIG. 4 corresponds to two complete cycles of the GENERATOR POWER. The effect of a one cycle disturbance or a single distorted waveform from the generator is thus somewhat diminished, providing a compensating distortion occurs during the next half cycle. The output of J-K flip-flop 120, Q, is coupled to the upper half of dual flip-flop 130. The upper half of dual flip-flop 130 is set by the output signal of J-K flip-flop 120 coincident with a clock signal, the clock signal being an output of oscillator 12. Oscillator 12 in the preferred embodiment is a 64 KHz signal. The output of the upper half of dual flip-flop 130 (pin 5) is shown as waveform D in FIG. 4. The output of the upper half of dual flip-flop 130 is coupled to the input of lower half of dual flip-flop 130. The lower half of dual flip-flop 130 is set by the output signal of upper half of dual flip-flop 130 coincident with the next clock signal from oscillator 12, which results in an output signal E of FIG. 4 which goes negative at the next clock signal. Waveform D and waveform E switch states one oscillator clock period, T, with respect to each other. The respective outputs of the upper and lower half of dual flip-flop 130 are coupled to NAND gate 140, the output of NAND gate 140, waveform f of FIG. 4, being high except during the one clock period when the signals of waveform D and E of FIG. 4 are both high. This results in a GATING SIGNAL essentially having a period of T2, or twice the period of the MONITOR INPUT frequency. The GATING SIGNAL is coupled to down counter 13. Down counter 13 of the preferred embodiment is shown comprised of three four-stage cascaded counters 160, 170, 180. During the one oscillator clock period T when the GATING SIGNAL is low, down counter 13 is set to a count of 2667. This count value corresponds to a MONITOR INPUT frequency of 48 Hz during the time that the GATING SIGNAL is high. Down counter 13 counts oscillator clock pulses counting down towards zero. If the MONITOR INPUT frequency is above 48 Hz the count will not reach zero before the next loading period (the zero level of the GATING SIGNAL) occurs. If the MONITOR INPUT frequency is below 48 Hz the count of down counter 13 will reach zero before the counter can be reset by the low level of the gating signal. When the count of down counter 13 reaches zero, an output signal is produced at the output of down counter 13 and is coupled to the up counter 14. Up counter 14 of the preferred embodiment comprises a four-stage counter, and an inverter 150. The signal coupled from down counter 13 causes the four-stage counter 190 to be unconditionally reset. The output of four-stage counter 190 goes low and is inverted to high level by gate 150. The output of gate 150 is coupled to extension relay control circuit 15 and causes the generation of the UNDER-FREQUENCY signal, for control of extension relay 7.

Once four-stage counter 190 has been reset, it remains reset until the GATING SIGNAL has gone through 16 complete cycles. If the generator has been shut down, four-stage counter 190 will not reach a full count again until the generator has been restarted and the time out relay 5 has been closed. The motor-generator control 3 prevents the time out relay 5 from closing before the motor and generator are up to speed so that the generator power will come up at a frequency near nominal. The voltage sensing circuit 210 of extension relay control circuit 15 is connected to insure that relay 240 will not be energized during motor-generator 1 start-up. A voltage regulator 22 is included for providing the power necessary to operate the circuits of frequency monitoring circuit 6.

Figure 3:
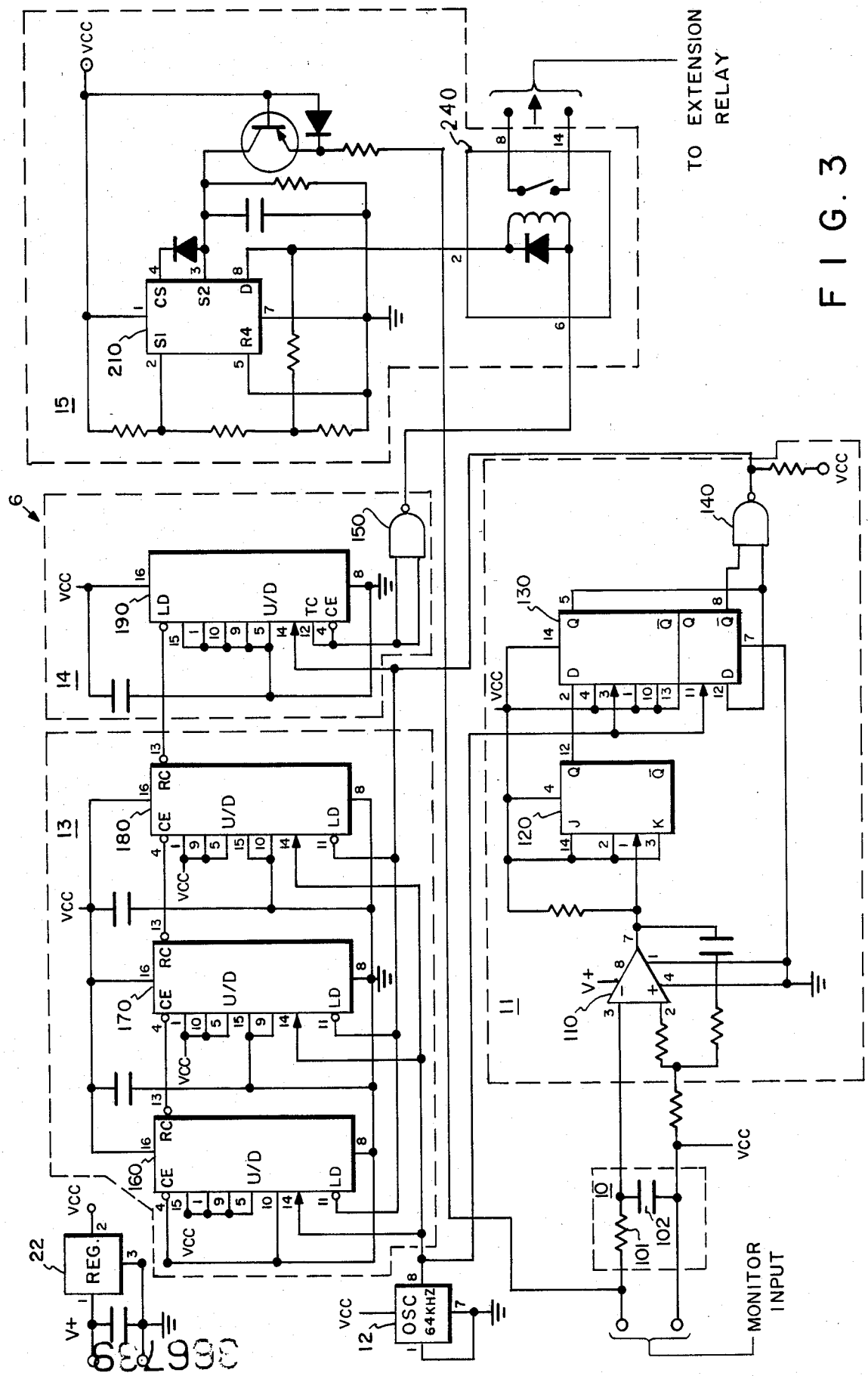
FIG. 3 shows a detailed logic diagram of the frequency monitoring circuit of FIG. 2.
Figure 4:
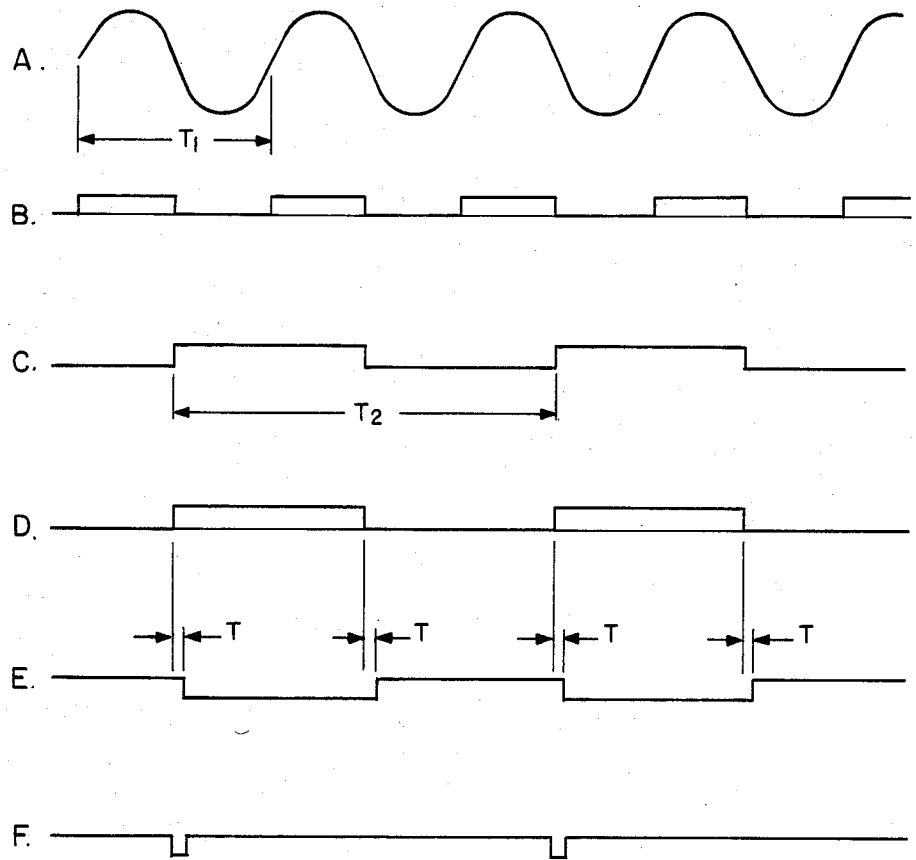
FIG. 4 shows various waveforms associated with the frequency monitoring circuit of FIG. 3.

FIG. 3 shows a detailed logic diagram of the preferred embodiment of the present invention. The specific integrated circuit components are delineated in Table 1. The numbers around the outside periphery of the block in the drawing indicate the integrated circuit pin numbers and the symbols internal to the block indicate the pin function by standard mnemonics recognized by those skilled in the art.

TABLE 1

| | |
|---|---|
| Comparator 110 | LM311 |
| J-K flip-flop 120 | 7473 |
| Dual D-type flip-flop 130 | 74LS74 |
| Voltage regulator 22 | 7805 |
| Relay 240 | 3.3 volt reed relay |
| Counters 160, 170, 180, 190 | 74LS191 |
| Voltage sensing (crow bar) circuit 210 | MC3423 |

While there has been shown what is considered to be the preferred embodiment of the invention, it will be manifest that many changes and modifications can be made therein without departing from the essential spirit and scope of the invention. It is intended, therefore, in the annexed claims, to cover all such changes and modifications which fall within the true scope of the invention.

We claim:

1. A ridethrough power generating system comprising:
    (a) motor-generator means, having an input terminal adapted to receive input power, for generating output power;
    (b) at least one power supply means for generating at least one form of converted power from said output power;
    (c) a motor-generator control means, operatively connected to said input terminal, for providing control of said output power; and
    (d) means for monitoring the frequency of said output power to operate in conjunction with said motor-generator control means thereby providing at least one additional control function of said output power.

2. A ridethrough power generating system according to claim 1, wherein a field winding is included in the motor-generator means, said motor-generator control means comprising:
    (a) control means, operatively connected to said field winding, for controlling generator excitation;
    (b) first relay means, connected in a series arrangement with the field winding and the control means, for interrupting the generator excitation after a predetermined time during which the input power has been continuously interrupted; and
    (c) second relay means, connected in a parallel configuration across said first relay means, for interrupting the generator excitation in response to control provided by the means for monitoring upon detecting an underfrequency condition of said output power.

3. A ridethrough power generating system, according to claim 2, wherein said means for monitoring comprising:
    (a) means, having an input terminal adapted to receive said output power, for generating a gating signal having a first and second state, the duration of the first state of said gating signal having a predetermined relationship to the frequency of said output power; and
    (b) means, having an input terminal adapted to receive a clock signal of a predetermined frequency, for counting said clock signal during an enable period of said means for counting determined by the first state of said gating signal, to generate an output signal when a predetermined count is attained, the predetermined count corresponding to the predetermined threshold value of frequency of said output power, said output signal coupled to said motor-generator control means for disabling the output power of the generator.

* * * * *